(12) United States Patent
Chen et al.

(10) Patent No.: US 12,610,656 B2
(45) Date of Patent: Apr. 21, 2026

(54) AIN LAYER, ITS FABRICATION PROCESS AND EPITAXIAL WAFER

(71) Applicant: FOCUS LIGHTINGS TECH CO., LTD., Suzhou (CN)

(72) Inventors: Chuanguo Chen, Suzhou (CN); Baokun Tang, Suzhou (CN); Zhijun Xu, Suzhou (CN); Han Jiang, Suzhou (CN); Weizi Song, Suzhou (CN); Xiaosong Rao, Suzhou (CN)

(73) Assignee: FOCUS LIGHTINGS TECH CO., LTD., Suzhou (CN)

( * ) Notice: Subject to any disclaimer, the term of this patent is extended or adjusted under 35 U.S.C. 154(b) by 640 days.

(21) Appl. No.: 17/927,509

(22) PCT Filed: Sep. 22, 2022

(86) PCT No.: PCT/CN2022/120552
§ 371 (c)(1),
(2) Date: Nov. 23, 2022

(87) PCT Pub. No.: WO2023/103529
PCT Pub. Date: Jun. 15, 2023

(65) Prior Publication Data
US 2024/0243219 A1     Jul. 18, 2024

(30) Foreign Application Priority Data
Dec. 7, 2021    (CN) .......................... 202111516961.4

(51) Int. Cl.
*H10H 20/01* (2025.01)
*C23C 14/00* (2006.01)
(Continued)

(52) U.S. Cl.
CPC ... *H10H 20/01335* (2025.01); *C23C 14/0036* (2013.01); *C23C 14/0617* (2013.01);
(Continued)

(58) Field of Classification Search
CPC .............. H10H 20/01335; H10H 20/82; C30B 23/025; C30B 29/403; C23C 14/0036; C23C 14/54; C23C 14/0617
(Continued)

(56) References Cited

U.S. PATENT DOCUMENTS 6,746,577 B1 *    6/2004    Barber ................... C23C 14/545
204/192.18

FOREIGN PATENT DOCUMENTS

CN         107546302 A       1/2018
CN         108538970 A       9/2018
(Continued)

OTHER PUBLICATIONS

Machine Translation CN 108538970 A (Year: 2018).*
Machine Translation CN 109962129 A (Year: 2019).*

*Primary Examiner* — Rodney G Mcdonald

(57)    ABSTRACT

The present application illustrates an AIN layer, a fabrication process and an epitaxial wafer, wherein the AIN layer is provided on a substrate layer, the substrate layer comprising a body and a protrusion, and the AIN layer comprising a first layer and a second layer; the first layer is disposed on the substrate; the second layer is disposed on the first layer; the AIN layer is layered or nucleated, the layered AIN layer is disposed on the body, and the nucleated AIN layer is disposed on the protrusion. The surface of the AIN layer fabricated according to the technical solution illustrated in the present application is uniform, and the surface roughness thereof can match a LED epitaxial wafer better.

9 Claims, 1 Drawing Sheet

(51) Int. Cl.

| | | |
|---|---|---|
| *C23C 14/06* | (2006.01) | |
| *C23C 14/54* | (2006.01) | |
| *H10H 20/82* | (2025.01) | |
| *C30B 23/02* | (2006.01) | |
| *C30B 29/40* | (2006.01) | |

(52) U.S. Cl.
    CPC ............. *C23C 14/54* (2013.01); *H10H 20/82* (2025.01); *C30B 23/025* (2013.01); *C30B 29/403* (2013.01)

(58) Field of Classification Search
    USPC ........................................ 204/192.12, 192.18
    See application file for complete search history.

(56)                References Cited

FOREIGN PATENT DOCUMENTS

| CN | 109962129 A | 7/2019 |
|---|---|---|
| CN | 110534403 A | 12/2019 |
| CN | 212277217 U | 1/2021 |
| CN | 114203876 A | 3/2022 |

* cited by examiner

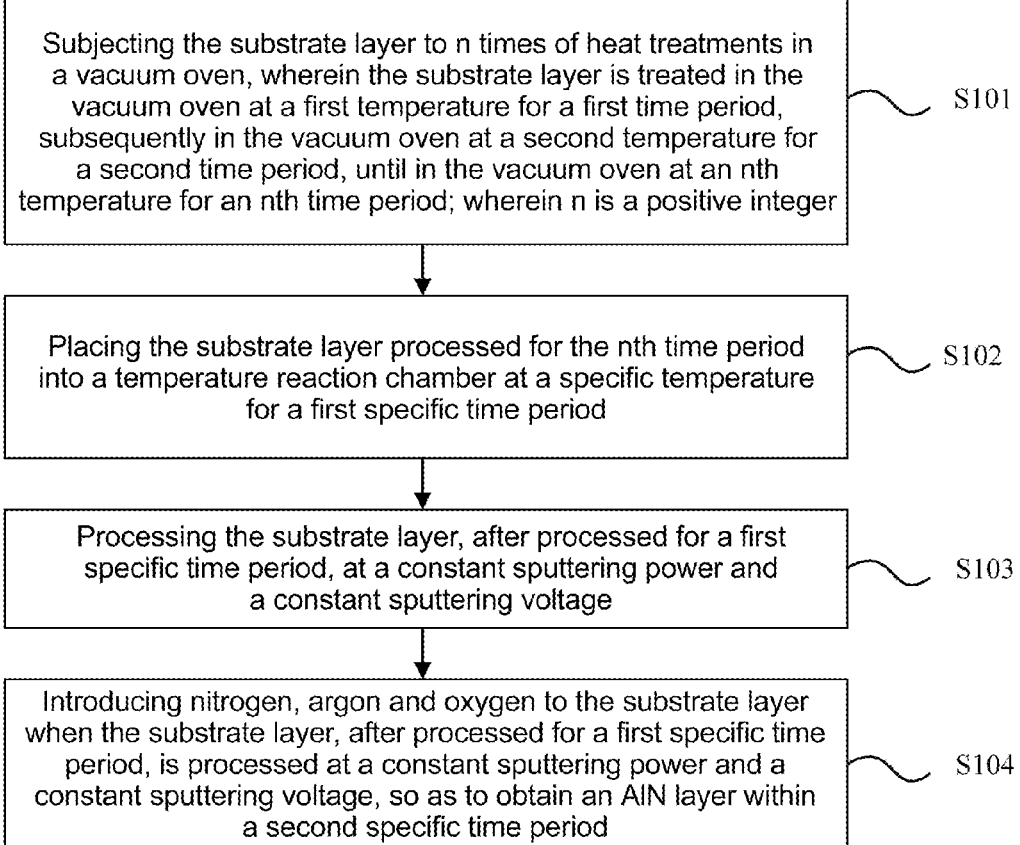

Subjecting the substrate layer to n times of heat treatments in a vacuum oven, wherein the substrate layer is treated in the vacuum oven at a first temperature for a first time period, subsequently in the vacuum oven at a second temperature for a second time period, until in the vacuum oven at an nth temperature for an nth time period; wherein n is a positive integer — S101

Placing the substrate layer processed for the nth time period into a temperature reaction chamber at a specific temperature for a first specific time period — S102

Processing the substrate layer, after processed for a first specific time period, at a constant sputtering power and a constant sputtering voltage — S103

Introducing nitrogen, argon and oxygen to the substrate layer when the substrate layer, after processed for a first specific time period, is processed at a constant sputtering power and a constant sputtering voltage, so as to obtain an AlN layer within a second specific time period — S104

Fig.1

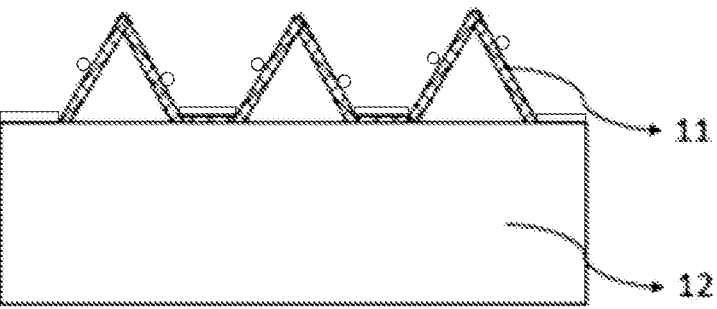

AIN LAYER, ITS FABRICATION PROCESS AND EPITAXIAL WAFER

FIELD OF THE PRESENT DISCLOSURE

The present application relates to the technical field of Light-emitting diode (LED) chip epitaxial growth, and particularly relates to an AlN layer, its fabrication process and epitaxial wafer.

BACKGROUND OF THE PRESENT DISCLOSURE

LED is a new type of energy-saving and environmental protection lighting source. Because of its low energy consumption, fast response and long service life, LED has been widely used in many fields. In the fabrication of LED, the lattice mismatch and thermal mismatch in the fabrication n of LED can be well solved by providing AlN buffer layers.

In the prior art, AlN layers are often fabricated by altering the amount of oxygen incorporation in sputter coatings or by ion beam assisted deposition techniques.

In the prior art, the process for fabricating the AlN layer has the problems of poor in-wafer uniformity of a growing epitaxial wafer caused by uneven aluminum plating and poor surface roughness not matching with the epitaxial wafer.

SUMMARY OF THE PRESENT DISCLOSURE

The present application provides an AlN layer, its fabrication process and epitaxial wafer. The surface of the AlN layer prepared according to the technical solutions illustrated in the present application is uniform, and the surface roughness thereof can match a LED epitaxial wafer better.

The present application shows a fabrication process of an AlN layer, the method comprising subjecting the substrate layer to n times of heat treatments in a vacuum oven, wherein the substrate layer is treated in the vacuum oven at a first temperature for a first time period, continuing to be treated in the vacuum oven at a second temperature for a second time period, until being treated in the vacuum oven at an nth temperature for an nth time period; n is a positive integer; placing the substrate layer processed for the nth time period into a temperature reaction chamber at a specific temperature for a first specific time period; processing the substrate layer, after processed for a first specific time period, at a constant sputtering power and a constant sputtering voltage; when the substrate layer, after processed for a first specific time period, is processed at a constant sputtering power and a constant sputtering voltage, introducing nitrogen, argon, and oxygen into the substrate layer to obtain an AlN layer within a second specific time period. With this embodiment, an AlN layer with a surface roughness more matching that of a LED epitaxial wafer can be obtained by subjecting the substrate layer to a segmentation heat treatment, and an AlN layer with a more uniform surface can be obtained by controlling the sputtering voltage to be constant for aluminizing by a voltage stabilizing program.

In some embodiments, the method further comprises after obtaining the AlN layer, growing a gallium nitride semiconductor layer on the AlN layer by a vapor phase epitaxial growth technique. The AlN layer prepared with this embodiment is used for better bonding with the gallium nitride semiconductor layer.

In some embodiments, the substrate layer comprises at least one of a sapphire substrate, a Si-based substrate, a SiC substrate, and a composite substrate. With this embodiment, a plurality of substrate layers can be selected to accommodate different LED preparation requirements.

In some embodiments, the temperature range of the first temperature, the second temperature, . . . , the nth temperature is less than or equal to 850° C.; the time period of the first time period, the second time period, . . . , the nth time period is less than or equal to 180 minutes; the range of values of n is less than or equal to 30. With this embodiment, an AlN layer with a surface roughness that matches that of the epitaxial wafer better can be obtained by subjecting the substrate layer to a segmentation heat treatment.

In some embodiments, the temperature range of the specified temperature is less than or equal to 850° C. With this embodiment, an AlN layer can be obtained with a surface roughness that matches that of the epitaxial wafer better.

In some embodiments, the sputtering power has a power range from 100 W to 20000 W; the sputtering voltage ranges from 220 volts to 270 volts. With this embodiment, an AlN layer with a more uniform surface can be obtained by controlling the sputtering voltage to be constant for aluminizing by a voltage stabilizing program.

In some embodiments, the nitrogen gas is introduced in an amount of 0.1 to 200 standard ml/min; the argon gas is introduced in an amount of 0.1 to 200 standard ml/min; the oxygen is introduced in an amount of 0.1 to 5 standard ml/min. With this embodiment, an AlN layer with a more uniform surface can be obtained by controlling the sputtering voltage to be constant for aluminizing by a voltage stabilizing program.

In some embodiments, the AlN layer has a surface roughness of 0.1 Å to 85 Å and the AlN layer has a thickness of 2 nm to 200 nm. With this embodiment, an AlN layer can be obtained with a uniform surface and a surface roughness that matches the LED epitaxial wafer better.

In some embodiments, the time period of the first specific time period ranges from 0.1 minute to 10 minutes; the second specific time period is determined according to the AlN layer thickness. With this embodiment, an AlN layer can be obtained with a uniform surface and a surface roughness that matches the LED epitaxial wafer better.

The present application also provides an AlN layer, the AlN layer being prepared according to the AlN layer fabrication process as described in the above embodiments.

An AlN layer is provided in the present application, wherein the AlN layer is provided on a substrate layer, and the substrate layer comprises a body and a protrusion; the AlN layer comprises a first layer and a second layer; wherein the first layer is disposed on the substrate, and the second layer is disposed on the first layer; the AlN layer is layered or nucleated, the layered AlN layer is disposed on the body, and the nucleated AlN layer is disposed on the protrusion.

In some embodiments, the thickness of the first layer is less than or equal to the thickness of the second layer.

In some embodiments, the first layer has a thickness of 10 nm to 15 nm; and the second layer has a thickness of 10 nm to 30 nm.

In some embodiments, the AlN layer has a surface roughness of 0.1 Å to 85 Å; and the AlN layer has a thickness of 2 nm to 200 nm.

The present application also provides an epitaxial wafer comprising the AlN layer, the substrate layer and the gallium nitride semiconductor layer of the above-mentioned embodiment; the AlN layer is provided on the substrate layer; a gallium nitride semiconductor layer is provided on the AlN layer.

In some embodiments, the substrate layer comprises at least one of a sapphire substrate, a Si-based substrate, a SiC substrate, and a composite substrate.

The above technical solutions illustrate that an AlN layer, its fabrication process and epitaxial wafer of the present application, firstly propose to obtain an AlN layer with a surface roughness more matching that of the epitaxial wafer by subjecting a substrate layer to a segmentation heat treatment, and firstly propose to obtain an AlN layer with a more uniform surface through controlling the sputtering voltage to be constant for aluminizing by a voltage stabilizing program. An AlN layer is provided on a substrate, the substrate comprising a body and a protrusion, and the AlN layer comprising a first layer and a second layer; the first layer is disposed on the substrate; the second layer is disposed on the first layer; the AlN layer is layered or nucleated, the layered AlN layer is disposed on the body, and the nucleated AlN layer is disposed on the protrusion. The surface of the AlN layer prepared according to the technical solution provided in the present application is uniform and has a certain roughness, so as to enable better matching between the substrate layer and the AlN layer, which can effectively reduce the dislocation density of the LED epitaxial wafer and improve the inter-wafer uniformity of the LED epitaxial wafer, and improve the growth yield of the LED epitaxial wafer and the LED light-emitting efficiency.

BRIEF DESCRIPTION OF THE DRAWINGS

In order to more clearly illustrate the technical solutions of the embodiments of the present application, the following is a brief description of the drawings which need to be used in the embodiments; it would be apparent for a person skilled in the art to obtain other drawings according to these drawings without involving any creative effort.

FIG. 1 is a process flow diagram of one way to provide an AlN layer according to some embodiments of the present application;

FIG. 2 is a schematic diagram of a structure for forming an AlN layer on a substrate layer according to some embodiments of the present application.

Wherein:

11—body, 12—protrusion.

DESCRIPTION OF THE EMBODIMENTS

To make the objects, embodiments and advantages of the present application clearer, the following is a clear and complete description of exemplary embodiments of the present application with reference to the attached drawings in exemplary embodiments of the present application, and it is apparent that the exemplary embodiments described are only a part of the embodiments of the present application, but rather than all thereof.

Based on the exemplary embodiments described herein, all other embodiments that can be obtained by a person of ordinary skill in the art without creative effort are within the scope of the claims appended herewith. Moreover, while the disclosure herein has been described in terms of one or more exemplary embodiments, it is to be understood that the disclosure may, in its aspects, constitute a single and complete embodiment. It should be noted that the brief description of terms in this application is merely for facilitating understanding of the embodiments described below and is not intended to limit the embodiments of the present application. Unless otherwise indicated, these terms should be understood in accordance with their general and conventional meaning.

The terms such as "first", "second", "third", and the like in the description and in the claims of the present application and in the above-described Figures are used for distinguishing similar objects from one another, rather than a particular sequential or chronological order. It is to be understood that the data so used are interchangeable under appropriate circumstances and that, for example, they can be carried out in sequences other than those illustrated or described herein.

FIG. 1 is a process flow diagram of one way to provide an AlN layer according to some embodiments of the present application. As shown in FIG. 1, the present disclosure illustrates a fabrication process of an AlN layer, the process comprising In step S101, subjecting the substrate layer to n times of heat treatments in a vacuum oven, wherein the substrate layer is treated in the vacuum oven at a first temperature for a first time period, continuing to be treated in the vacuum oven at a second temperature for a second time period, until being treated in the vacuum oven at an nth temperature for an nth time period; wherein n is a positive integer;

in some embodiments, the substrate layer comprises at least one of a sapphire substrate, a Si-based substrate, a SiC substrate, and a composite substrate. With this embodiment, a plurality of substrate layers can be selected to accommodate different LED preparation requirements.

It should be noted that the present application includes but is not limited to being applied to the substrate layer mentioned in the above-mentioned embodiments, and the present application only takes the above-mentioned substrate layer as an example. In particular implementations, since the substrate layer is generally selected from materials with stability, the technical solution illustrated in the present application is applicable to most substrate layers.

In some embodiments, the temperature of the first temperature, the second temperature, . . . , the nth temperature ranges from 0.1° C. to 850° C.; the time period range of the first time period, the second time period, . . . , the nth time period is less than or equal to 850° C.; the time period of the first time period, the second time period, . . . , the nth time period is less than or equal to 180 minutes; the range of values of n is less than or equal to 30. With this embodiment, an AlN layer with a surface roughness that matches that of the epitaxial wafer better can be obtained by subjecting the substrate layer to a segmentation heat treatment.

In step S102, placing the substrate layer processed for the nth time period into a temperature reaction chamber at a specific temperature for a first specific time period.

In some embodiments, the temperature range of the specified temperature is less than or equal to 850° C. With this embodiment, an AlN layer can be obtained with a surface roughness that matches that of the epitaxial wafer better.

In some embodiments, the time period of the first specific time period is less than or equal to 10 minutes.

In step S103, processing the substrate layer, after processed for a first specific time period, at a constant sputtering power and a constant sputtering voltage.

In some embodiments, the sputtering power has a power range from 100 W to 20000 W; the sputtering voltage ranges from 220 volts to 270 volts. With this embodiment, an AlN layer with a more uniform surface can be obtained through controlling the sputtering voltage to be constant for aluminizing by a voltage stabilizing program.

In step S104, when the substrate layer, after processed for a first specific time period, is processed at a constant sputtering power and a constant sputtering voltage, introducing nitrogen, argon and oxygen to the substrate layer to obtain an AlN layer within a second specific time period.

In some embodiments, the nitrogen gas is introduced in an amount of 0.1 to 200 standard ml/min; the argon gas is introduced in an amount of 0.1 to 200 standard ml/min; the oxygen is introduced in an amount of 0.1 to 5 standard ml/min. With this embodiment, an AlN layer with a more uniform surface can be obtained through controlling the sputtering voltage to be constant for aluminizing by a voltage stabilizing program.

In some embodiments, the second specific time period is determined according to the AlN layer thickness.

In some embodiments, the AlN layer has a roughness of 0.1 Å to 85 Å; and the AlN layer has a thickness of 2 nm to 200 nm.

In some embodiments, the process further comprises:

After the AlN layer is obtained, a gallium nitride semiconductor layer is grown on the AlN layer by a vapor phase epitaxial growth technique. The AlN layer prepared in this embodiment is used for bonding with the gallium nitride semiconductor layer better.

In some embodiments, the present application also provides an AlN layer, the AlN layer prepared according to the AlN layer fabrication process as described in the above embodiments.

The following is a specific implementation process of an embodiment of the present application:

In a feasible embodiment, the substrate layer is subjected to twice heat treatments in a vacuum oven, wherein the substrate layer is a sapphire substrate; the substrate layer is treated in a vacuum oven at a temperature of 650° C. for 30 minutes and subsequently in a vacuum oven at a temperature of 550° C. for 30 minutes;

The treated substrate layer is placed into a temperature reaction chamber at 550° C. for treatment for 5 minutes;

The substrate layer, after processing for a first specific time period, is processed at a constant sputtering power of 3500 W and a constant sputtering voltage of 230V;

The substrate layer is introduced with nitrogen at 150 standard ml/min, argon at 30 standard ml/min and oxygen at 2 standard ml/min to obtain an AlN layer in 35 seconds.

The surface roughness of the AlN layer prepared by the above-mentioned embodiment is 24.389 Å, the standard deviation of the film thickness is 0.0161, and the thickness of the AlN layer is 15 nm; an epitaxial wafer is prepared by growing a gallium nitride semiconductor layer on the AlN layer by a phase epitaxial growth technique.

In a feasible embodiment, the substrate layer is subjected to twice heat treatments in a vacuum oven, wherein the substrate layer is a Si-based substrate; the substrate layer is treated in a vacuum oven at a temperature of 450° C. for 100 minutes and subsequently in a vacuum oven at a temperature of 750° C. for 20 minutes;

The treated substrate layer is placed into a temperature reaction chamber at 550° C. for treatment for 5 minutes;

the substrate layer, after processing for a first specific time period, is processed at a constant sputtering power of 3000 W and a constant sputtering voltage of 235V;

the substrate layer is introduced with nitrogen at 130 standard ml/min, argon at 25 standard ml/min and oxygen at 1.5 standard ml/min to obtain an AlN layer in 45 seconds.

The surface roughness of the AlN layer prepared by the above-mentioned embodiment is 29.125 Å, the standard deviation of the film thickness is 0.0745, and the thickness of the AlN layer is 18 nm; an epitaxial wafer is prepared by growing a gallium nitride semiconductor layer on the AlN layer by a phase epitaxial growth technique.

In a feasible embodiment, the substrate layer is subjected to three heat treatments in a vacuum oven, wherein the substrate layer is a $SiO_2$-sapphire composite substrate; the substrate layer is treated in a vacuum oven at a temperature of 700° C. for 10 minutes, subsequently in a vacuum oven at a temperature of 600° C. for 10 minutes and then in a vacuum oven at a temperature of 500° C. for 10 minutes;

the treated substrate layer is placed into a temperature reaction chamber at 550° C. for treatment for 5 minutes;

the substrate layer, after processing for a first specific time period, is processed at a constant sputtering power of 4000 W and a constant sputtering voltage of 243V;

the substrate layer is introduced with nitrogen at 120 standard ml/min, argon at 20 standard ml/min and oxygen at 1 standard ml/min to obtain an AlN layer in 55 seconds.

The surface roughness of the AlN layer prepared by the above-mentioned embodiment is 34.248 Å, the standard deviation of the film thickness is 0.0812, and the thickness of the AlN layer is 23 nm; an epitaxial wafer is prepared by growing a gallium nitride semiconductor layer on the AlN layer by a phase epitaxial growth technique.

The AlN layer prepared in the embodiment of the above specific implementation process has a good inter-wafer uniformity after an ellipsometer test; photoluminescence (PL) measurements were carried out on the epitaxial wafer prepared according to the AlN layer, and the yield of the epitaxial wafer was significantly improved. X-ray diffraction (XRD) measurements were carried out on the epitaxial wafer prepared based on the AlN layer, and the full width at half maximum of different surface layers significantly improved.

In some embodiments, the present application also provides an AlN layer, wherein the AlN layer is provided on a substrate layer, the substrate layer comprising a body 11 and a protrusion 12, the AlN layer comprising a first layer and a second layer; the first layer is disposed on the substrate; the second layer is disposed on the first layer; the AlN layer is layered or nucleated, the layered AlN layer is disposed on the body 11 and the nucleated AlN layer is disposed on the protrusion 12.

FIG. 2 is a schematic diagram of a structure after an AlN layer is formed on a substrate layer.

As shown in FIG. 2, the substrate layer comprises a body 11 and a protrusion 12, wherein the protrusion 12 is disposed on the body 11, and since the substrate layer is a patterned substrate layer, the protrusion 12 protruding from the body 11 is provided, that is to say, the side for forming the AlN layer is not smooth, but has a certain roughness. The AlN layer comprises a first layer and a second layer, wherein near the surface of the substrate layer, the first layer is formed firstly, and then the second layer is formed on the first layer, and since the substrate layer has a surface with a certain roughness, the AlN layer is formed as a layered structure on the body 11, and a crystal nucleus-like structure is formed on the protrusion 12, so that the surface of the formed AlN layer also has a certain roughness, enabling a better matching between the substrate layer and the AlN layer, which can effectively reduce the dislocation density of the epitaxial wafer and improve the inter-wafer uniformity between epitaxial wafers, and improve the growth yield of the epitaxial wafer and the LED light-emitting efficiency.

In some embodiments, the thickness of the first layer is less than or equal to the thickness of the second layer. In preparing the first layer and the second layer, the thickness of the first layer and the second layer is controlled by time and power. Specifically, the first layer has a short preparation time, a high oxygen flux, and a small thickness, and thus plays a transitional role. The second layer has a long preparation time and a low oxygen flux.

In some embodiments, the first layer has a thickness of 10 nm to 15 nm; and the second layer has a thickness of 10 nm to 30 nm.

In some embodiments, the AlN layer has a surface roughness of 0.1 Å to 85 Å; the AlN layer has a thickness of 2 nm to 200 nm, so that the AlN layer has a uniform surface and its surface roughness can match the LED epitaxial wafer better.

Embodiments of the present application also provide an epitaxial wafer comprising the AlN layer, the substrate layer and the gallium nitride semiconductor layer of the above-mentioned embodiment; the AlN layer is provided on the substrate layer; a gallium nitride semiconductor layer is provided on the AlN layer; wherein a gallium nitride semiconductor layer is grown on the AlN layer by a vapor phase epitaxial growth technique. Since the surface of the AlN layer in this example is uniform and has a certain roughness, good bonding with the gallium nitride semiconductor layer can be achieved.

In some embodiments, the substrate layer comprises at least one of a sapphire substrate, a Si-based substrate, a SiC substrate, and a composite substrate. With this embodiment, a plurality of substrate layers can be selected to accommodate different LED preparation requirements.

The above scheme illustrates that an AlN layer, its fabrication process and epitaxial wafer of the present application, firstly propose to obtain an AlN layer with a surface roughness matching that of the epitaxial wafer better by subjecting a substrate layer to a stepwise heat treatment, and firstly propose to obtain an AlN layer with a more uniform surface through controlling the sputtering voltage to be constant for aluminizing by a voltage stabilizing program. The surface of the AlN layer prepared according to the technical solution illustrated in the present application is uniform and has a certain roughness, so that better matching can be performed between the substrate layer and the AlN layer, which can effectively reduce the dislocation density of the epitaxial wafer and improve the inter-wafer uniformity of the epitaxial wafer, and improve the growth yield of the epitaxial wafer and the LED light-emitting efficiency. Finally, it should be noted that: the above-mentioned embodiments are merely illustrative, rather than restrictive, for the technical solution of the present application; although the present application has been described in detail with reference to the foregoing embodiments, those skilled in the art will appreciate that the technical solutions disclosed in the above-mentioned embodiments can still be modified, or some or all of the technical features thereof can be replaced by equivalents; and these modifications or replacements do not make the corresponding technical solutions departing from the scope of the technical solutions of the embodiments of the present application.

The foregoing description, for purposes of explanation, has been presented in connection with specific embodiments. However, the above exemplary discussion is not intended to be exhaustive or to limit the embodiments to the specific forms disclosed. Many modifications and variations are possible in light of the above teaching. The embodiments were chosen and described in order to best illustrate the principles and practical applications, thereby enabling the skilled in the art to best implement the embodiments and various embodiments with various modifications as are suitable for the particular use contemplated.

What is claimed is:

1. A fabrication process of an AlN layer, comprising subjecting a substrate layer to n times of heat treatments in a vacuum oven, wherein the substrate layer is treated in the vacuum oven at a first temperature for a first time period, subsequently treated in the vacuum oven at a second temperature for a second time period, until treated in the vacuum oven at an nth temperature for an nth time period; n is a positive integer, wherein the first time period, the second time period, and up to and including the nth time period is equal to or longer than 10 minutes and less than or equal to 180 minutes;

placing the substrate layer processed for the nth time period into a temperature reaction chamber at a specific temperature for a first specific time period;

processing the substrate layer, after processed for the first specific time period, at a constant sputtering power and a constant sputtering voltage;

when the substrate layer, after processed for the first specific time period, is processed at the constant sputtering power and the constant sputtering voltage, introducing nitrogen, argon and oxygen into the substrate layer to obtain an AlN layer within a second specific time period.

2. The fabrication process of an AlN layer according to claim 1, further comprising after obtaining the AlN layer, growing a gallium nitride semiconductor layer on the AlN layer by a vapor phase epitaxial growth technique.

3. The fabrication process of an AlN layer according to claim 1, characterized in that the substrate layer comprises at least one of a sapphire substrate, a Si-based substrate, a SiC substrate, and a composite substrate.

4. The fabrication process of an AlN layer according to claim 1, characterized in that a temperature range of the first temperature, the second temperature, the nth temperature is less than or equal to 850° C.; the range of values of n is less than or equal to 30.

5. The fabrication process of an AlN layer according to claim 1, characterized in that a temperature range of the specific temperature is less than or equal to 850C.

6. The fabrication process of an AlN layer according to claim 1, characterized in that the sputtering power has a power range of 100 W to 20000 W; the sputtering voltage ranges from 220 volts to 270 volts.

7. The fabrication process of an AlN layer according to claim 1, characterized in that the nitrogen gas is introduced in an amount of 0.1 to 200 standard ml/min; the argon gas is introduced in an amount of 0.1 to 200 standard ml/min; the oxygen is introduced in an amount of 0.1 to 5 standard standard ml/min.

8. The fabrication process of an AlN layer according to claim 1, characterized in that the AlN layer has a surface roughness of 0.1 Å to 85 Å; the AlN layer has a thickness of 2 nm to 200 nm.

9. The fabrication process of an AlN layer according to claim 1, characterized in that a time period of the first specific time period is less than or equal to 10 minutes; the second specific time period is determined according to the AlN layer thickness.

* * * * *